(12) United States Patent
Uenda et al.

(10) Patent No.: US 8,524,007 B2
(45) Date of Patent: *Sep. 3, 2013

(54) CLEANING SHEET, TRANSFER MEMBER PROVIDED WITH CLEANING FUNCTION, AND METHOD FOR CLEANING SUBSTRATE PROCESSING APPARATUS

(75) Inventors: Daisuke Uenda, Osaka (JP); Yukio Arimitsu, Osaka (JP); Yoshio Terada, Osaka (JP); Yasuhiro Amano, Osaka (JP); Akihisa Murata, Osaka (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/977,762

(22) Filed: Dec. 23, 2010

(65) Prior Publication Data

US 2011/0088721 A1    Apr. 21, 2011

Related U.S. Application Data

(63) Continuation of application No. 12/067,235, filed as application No. PCT/JP2006/320366 on Oct. 12, 2006.

(30) Foreign Application Priority Data

Oct. 25, 2005    (JP) .................................. 2005-309764

(51) Int. Cl.
*B08B 7/00* (2006.01)
*B32B 3/30* (2006.01)
*B32B 17/10* (2006.01)

(52) U.S. Cl.
USPC ................. 134/6; 134/42; 428/167; 428/172; 428/409

(58) Field of Classification Search
USPC ............... 134/6, 42; 148/167, 172, 220, 409; 15/1.51, 208, 228; 428/167, 172, 220, 409
See application file for complete search history.

(56) References Cited

U.S. PATENT DOCUMENTS 6,753,065 B2    6/2004    Okuyama
6,821,620 B2    11/2004    Namikawa et al.

(Continued)

FOREIGN PATENT DOCUMENTS

JP    61-180665 U    11/1986
JP    10-154686 A    6/1998

(Continued)

OTHER PUBLICATIONS

Japanese Office Action dated Jun. 8, 2011, issued in corresponding Japanese Patent Application No. 2006-272797.

(Continued)

*Primary Examiner* — Saeed T Chaudhry
(74) *Attorney, Agent, or Firm* — Westerman, Hattori, Daniels & Adrian, LLP

(57) ABSTRACT

A cleaning sheet including a cleaning layer which has a microasperity shape having an arithmetic average roughness Ra of 0.05 μm or less and a maximum height Rz of 1.0 μm or less. Preferably, a substantial surface area of the cleaning layer per a flat surface of 1 mm2 is 150% or more of a substantial surface area of a silicon wafer mirror surface per a flat area of 1 mm2. The cleaning sheet may be provided on at least one surface of a transfer member so that the transfer member has a cleaning function. When the cleaning sheet or the transfer member having a cleaning function is transferred in a substrate processing apparatus in place of a substrate to be processed therein, the cleaning sheet contacts and cleans a site of the substrate processing apparatus.

8 Claims, 2 Drawing Sheets

(56) References Cited

U.S. PATENT DOCUMENTS

| | | |
|---|---|---|
| 2003/0136430 A1 | 7/2003 | Namikawa et al. |
| 2003/0180532 A1 | 9/2003 | Namikawa et al. |
| 2004/0081839 A1 | 4/2004 | Kubo et al. |
| 2004/0204334 A1 | 10/2004 | Terada et al. |
| 2005/0244632 A1 | 11/2005 | Namikawa et al. |
| 2006/0105164 A1 | 5/2006 | Namikawa et al. |

FOREIGN PATENT DOCUMENTS

| | | | |
|---|---|---|---|
| JP | 11-087458 A | | 3/1999 |
| JP | 2000-011342 | * | 1/2000 |
| JP | 2000-11342 A | | 1/2000 |
| JP | 2001-112703 A | | 4/2001 |
| JP | 2002-059098 A | | 2/2002 |
| JP | 2005-032971 A | | 2/2005 |
| JP | 2005-052784 | * | 3/2005 |
| JP | 2005-052784 A | | 3/2005 |
| JP | 2005-218968 | * | 8/2005 |
| JP | 2005-218968 A | | 8/2005 |
| JP | 2005-270553 A | | 10/2005 |
| TW | 200503093 | | 1/2005 |

OTHER PUBLICATIONS

Supplementary European Search Report dated Oct. 13, 2010, issued in corresponding European Patent Application No. 06811663.1.

* cited by examiner

CLEANING SHEET, TRANSFER MEMBER PROVIDED WITH CLEANING FUNCTION, AND METHOD FOR CLEANING SUBSTRATE PROCESSING APPARATUS

CROSS-REFERENCE TO RELATED APPLICATIONS

This application is a continuation of U.S. application Ser. No. 12/067,235, filed on Mar. 18, 2008, which is a 371 of International Application No. PCT/JP2006/320366, filed on Oct. 12, 2006, which is based upon and claims the benefit of priority from the prior Japanese Patent Application No. 2005-309764, filed on Oct. 25, 2005, the entire contents of which are incorporated herein by reference.

TECHNICAL FIELD

The present invention relates to a cleaning sheet and a transfer member provided with a cleaning function. More specifically, the present invention relates to a cleaning sheet and a transfer member provided with a cleaning function, which have excellent foreign matter removing performance and transfer performance and which can remove foreign matters having a predetermined particle diameter with especially high efficiency. The present invention also relates to a method of cleaning a substrate processing apparatus using such a cleaning sheet and a transfer member provided with a cleaning function.

BACKGROUND ART

In various kinds of substrate processing apparatuses that are apt to be easily damaged by foreign matters, such as a production apparatus and an inspection apparatus of a semiconductor, a flat panel display, and a printed board, each transfer system and a substrate are transferred while they are brought into contact with each other. In this case, when foreign matters adhere to the substrate and the transfer systems, the subsequent substrates are contaminated one after another, so it is necessary to stop the apparatus periodically so as to clean the apparatus. As a result, there arise problems in that the operation rate of the processing apparatus decreases, and that a great amount of time and labor are required for cleaning the apparatus.

In order to solve such problems described above, a method of removing foreign matters adhering to a back surface of a substrate by transferring a plate-shaped member has been proposed (see Patent Document 1). According to the method, it is not necessary to stop a substrate processing apparatus so as to clean the member, and the problem of decrease in the operation rate of the processing apparatus is solved. However, according to this method, foreign matters cannot be removed sufficiently.

On the other hand, a method of removing foreign matters adhering to the processing apparatus by transferring a substrate with an adherent material adhering thereto in the substrate processing apparatus as a cleaning member has been proposed (see Patent Document 2). This method has not only the advantage of the method described in Patent Document 1, but also the excellent foreign matter removing performance. Therefore, this method solves the problem in that the operation rate of the processing apparatus decreases and the problem in that a great amount time and labor are required for cleaning the apparatus. However, according to the method described in Patent Document 2, the adherent material and the apparatus are bonded to each other too strongly in a contact portion, so they may not come away from each other. Consequently, there arise problems in that the substrate may not be transferred securely, and that a transfer apparatus may be damaged.

Recently, along with an increase in fineness of semiconductor devices, the adhesion of foreign matters to a wafer back surface as well as a wafer front surface becomes a problem. This is because the foreign matters transfer from the wafer back surface to the wafer front surface during a cleaning step, which decreases the production yield. At present, semiconductor elements with a wire width of 65 nm have started being mass-produced, and when a foreign matter of a size equal to or larger than the wire width adheres to a semiconductor element, a defect such as disconnection is likely to occur. In particular, a foreign matter having a particle diameter of about 0.1 to 2.0 μm is a problem. However, any of the related arts are insufficient for removing foreign matters having a predetermined particle diameter with especially high efficiency.

Patent Document 1: JP 11-87458 A (P.2 to P.3)
Patent Document 2: JP 10-154686 A (P.2 to P.4)

DISCLOSURE OF THE INVENTION

Problems to be Solved by the Invention

The present invention has been made to solve the above conventional problems, and an object of the present invention is to provide a cleaning sheet and a transfer member provided with a cleaning function (hereinafter, which may be referred to as a cleaning member collectively), which have excellent foreign matter removing performance and transfer performance, and which can remove foreign matters having a predetermined particle diameter with especially high efficiency. Another object of the present invention is to provide a method of cleaning a substrate processing apparatus using such cleaning member described above.

Means for Solving the Problems

The inventors of the present invention studied earnestly, and found that the above object can be achieved by subjecting a cleaning layer to predetermined roughening to form particular microasperity on the surface of the cleaning layer, thereby achieving the present invention.

According to one aspect of the invention, a cleaning sheet is provided. The cleaning sheet includes a cleaning layer having a microasperity shape having an arithmetic average roughness Ra of 0.05 μm or less and a maximum height Rz of 1.0 μm or less.

In one embodiment of the invention, the microasperity shape is a groove structure.

In another embodiment of the invention, a substantial surface area of the cleaning layer per a flat surface of 1 $mm^2$ is 150% or more of a substantial surface area of a silicon wafer mirror surface per a flat area of 1 $mm^2$.

In still another embodiment of the invention, the cleaning layer has an elastic modulus in tension of 0.98 MPa to 4900 MPa.

According to another aspect of the invention, a transfer member provided with a cleaning function is provided. The transfer member provided with a cleaning function includes a transfer member and the cleaning layer provided on at least one surface of the transfer member.

In one embodiment of the invention, the cleaning layer is directly attached to the transfer member. In another embodiment of the invention, the cleaning layer is attached to the transfer member via a pressure-sensitive adhesive layer.

According to still another aspect of the invention, a method of cleaning a substrate processing apparatus is provided. The method of cleaning a substrate processing apparatus includes transferring the cleaning sheet or the transfer member provided with a cleaning function to the substrate processing apparatus.

Effects of the Invention

As described above, according to the present invention, by using a cleaning layer having a predetermined surface roughness, a cleaning member that is not only excellent in transfer performance and foreign matter removing performance, but also is capable of removing foreign matters having a predetermined particle diameter with especially high efficiency is obtained.

Figure 1:
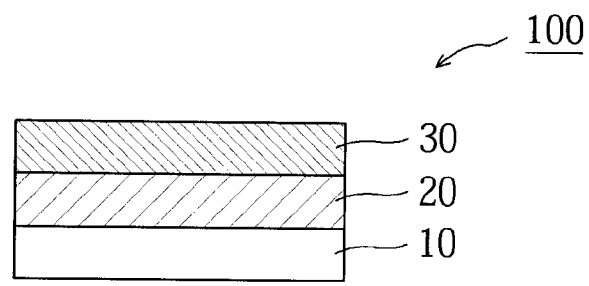
FIG. 1 is a schematic cross-sectional view of a cleaning sheet according to a preferred embodiment of the present invention.

REFERENCE NUMERALS 10 support
20 cleaning layer
30 peeling liner
40 adhesive layer
50 transfer member
100 cleaning sheet
200 transfer member provided with a cleaning function

BEST MODE FOR CARRYING OUT THE INVENTION

A. Cleaning Sheet

FIG. 1 is a schematic cross-sectional view of a cleaning sheet according to a preferred embodiment of the present invention. A cleaning sheet 100 has a support 10, a cleaning layer 20, and a peeling liner 30. The support 10 and/or the peeling liner 30 may be omitted depending upon the purpose. More specifically, the cleaning sheet may be composed of a cleaning layer alone.

The cleaning layer 20 has a microasperity shape having an arithmetic average roughness Ra of 0.05 μm or less and a maximum height Rz of 1.0 μm or less. Due to such an arithmetic average roughness and a maximum height, the cleaning layer 20 has a surface area remarkably larger than a smooth surface and a surface shape with microasperity of a small size (depth). The cleaning layer has such a particular surface shape, it can remove foreign matters having a predetermined particle diameter (typically, 0.1 to 2.0 μm) with especially high efficiency. The arithmetic average roughness Ra is preferably 0.04 μm or less, and more preferably 0.03 μm or less. On the other hand, the lower limit of the arithmetic average roughness Ra is preferably 0.0002 μm, more preferably 0.0004 μm, still more preferably 0.002 μm, and particularly preferably 0.004 μm. The maximum height Rz is preferably 0.8 μm or less, and more preferably 0.7 μm or less. On the other hand, the lower limit of the maximum height Rz is preferably 0.1 μm, more preferably 0.2 μm, and particularly preferably 0.3 μm. The arithmetic average roughness and the maximum height are both defined under JIS B0601. The arithmetic average roughness and the maximum height are measured by, for example, the following procedure: using a diamond stylus with a curvature of a tip end portion of 2 μm in a stylus surface roughness tester (P-11 (trade name) manufactured by Tencor Corp.), data is captured at a stylus pressing force of 5 mg, a measurement speed of 1 μm/sec. (measurement length: 100 μm), and a sampling period of 200 Hz. The arithmetic average roughness is calculated with a cut-off value being 25 to 80 μm.

The substantial surface area of the cleaning layer per a flat surface of 1 mm$^2$ is preferably 150% or more, more preferably 160% or more, and most preferably 170% or more with respect to the substantial surface area of the silicon wafer mirror surface per a flat surface of 1 mm$^2$. On the other hand, the substantial surface area of the above cleaning layer per a flat surface of 1 mm$^2$ is preferably 220% or less, and more preferably 200% or less with respect to the substantial surface area of the silicon wafer mirror surface per a flat surface of 1 mm$^2$. By setting a surface roughness as described above, foreign matters having a predetermined particle diameter (typically, 0.1 μm or more, preferably 0.1 to 2.0 μm) can be removed with especially high efficiency.

As the shape of microasperity of the cleaning layer 20, any suitable shape can be adopted as long as the cleaning layer 20 has the above surface shape (surface roughness). Specific examples of the microasperity shape include a groove shape, a stripe shape, a protrusion shape, a hollow (dimple) shape, and a rough surface shape like a glasspaper surface. The groove shape is preferred. This is because the groove shape is excellent in foreign matter removing performance, although not clarified theoretically.

The elastic modulus in tension of the cleaning layer is preferably 0.5 MPa or more and more preferably 1 to 1,000 MPa in a use temperature range of a cleaning member. If the elastic modulus in tension is in this range, a cleaning member excellent in the balance between the foreign matter removing performance and the transfer performance is obtained. In one embodiment, the elastic modulus in tension is 0.98 to 4,900 MPa. In such a case, a remarkable effect is obtained in the cleaning of a substrate processing apparatus for a flat panel display. The elastic modulus in tension is measured in accordance with JIS K7127.

The 180° peeling adhesive strength of the cleaning layer with respect to a silicon wafer mirror surface, for example, is preferably 0.2 N/10 mm width or less, and more preferably 0.01 to 0.10 N/10 mm width. In such a range, the cleaning layer has satisfactory foreign matter removing performance and transfer performance. The 180° peeling adhesive strength is measured in accordance with JIS Z0237.

The thickness of the cleaning layer is preferably 0.1 to 2 mm, and more preferably 0.2 to 1 mm. In such a thickness, even the cleaning layer alone can have a self-support property capable of being transferred and removing foreign matters. Further, the thickness of the cleaning layer in the case where a cleaning sheet has a support is preferably 1 to 100 μm, more preferably 5 to 100 μm, still more preferably 5 to 50 μm, and particularly preferably 10 to 50 μm. In such a range, a cleaning member excellent in the balance between foreign matter removing performance and transfer performance is obtained.

Next, the material forming the cleaning layer 20 will be described. As the material forming the cleaning layer, any suitable material can be adopted in accordance with the purpose and the method of forming microasperity. Specific examples of the material forming the cleaning layer include a heat-resistant resin and an energy ray curable resin.

cifically, the aliphatic diamine represented by the following chemical formula is exemplified. The aliphatic diamine may be used alone or used together with another diamine. Examples of the diamine used in combination include 4,4'-diaminodiphenylether, 3,4'-diaminodiphenylether, 3,3'-diaminodiphenylether, m-phenylenediamine, p-phenylenediamine, 4,4'-diaminodiphenylpropane, 3,3'-diaminodiphenylpropane, 4,4'-diaminodiphenylmethane, 3,3'-diaminodiphenylmethane, 4,4'-diaminodiphenylsulfide, 3,3'-diaminodiphenylsulfide, 4,4'-diaminophenylsulfone, 3,3'-diaminodiphenylsulfone, 1,4-bis(4-aminophenoxy)benzene, 1,3-bis(4-aminophenoxy)benzene, 1,3-bis(3-aminophenoxy)benzene, 1,3-bis(4-aminophenoxy)-2,2-dimethylpropane, hexamethylenediamine, 1,8-diaminooctane, 1,12-diaminododecane, 4,4'-diaminobenzophenone, and 1,3-bis(3-aminopropyl)-1,1,3,3-tetramethyldisiloxane.

[Chemical Formula 1]

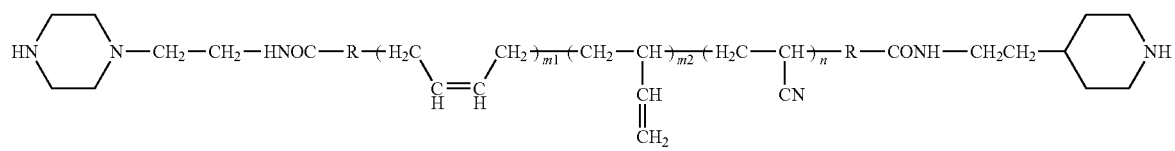

($m1$ and $m2$ represent integers of 0 or more, n represents an integer of 1 or more, R represents a single bond or an organic group.)

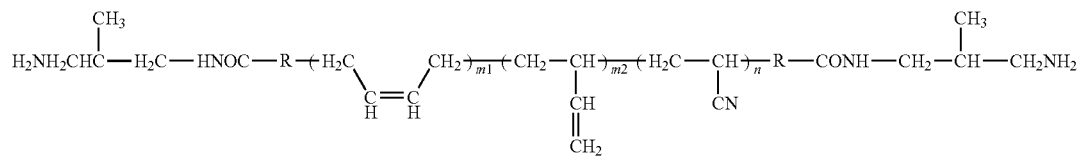

($m1$ and $m2$ represent integers of 0 or more, n represents an integer of 1 or more, R represents a single bond or an organic group.)

Another specific example of the diamine component includes a diamine compound having two terminals having an amine structure and having a polyether structure (hereinafter, referred to as PE diamine compound). The PE diamine compound is preferred for obtaining a polyimide resin with a low modulus of elasticity, which has high heat resistance and a low stress. As the PE diamine compound, any suitable compound can be adopted as long as it has a polyether structure and at least two terminals having an amine structure. Examples of the compound include terminal diamine having a polypropylene glycol structure, terminal diamine having a polyethylene glycol structure, terminal diamine having a polytetramethylene glycol structure, and terminal diamine having plurality of those structures. Of those, a PE diamine compound prepared from ethylene oxide, propylene oxide, polytetramethylene glycol or a mixture thereof, and polyamine is preferred.

As the heat-resistant resin, a resin containing no material that contaminates a substrate processing apparatus is preferred. Examples of such a resin include a heat-resistant resin used in a semiconductor production apparatus. Specific examples thereof include polyimide and a fluorine resin. Polyimide is preferred. This is because polyimide is excellent in operability in the case of forming microasperity by a nozzle method (described later).

Preferably, the polyimide can be obtained by imidizing polyamic acid having a butadiene-acrylonitrile copolymer skeleton in a main chain. The polyamic acid can be obtained by reacting a tetracarboxylic dianhydride component and a diamine component in any suitable organic solvent in a substantially equimolar ratio.

Examples of the tetracarboxylic dianhydride component include 3,3',4,4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 4,4'-oxydiphthalic dianhydride, 2,2-bis(2,3-dicarboxyphenyl)hexafluoropropane dianhydride, 2,2-bis(3,4-dicarboxyphenyl)hexafluoropropane dianhydride (6FDA), bis(2,3-dicarboxyphenyl)methane dianhydride, bis(3,4-dicarboxyphenyl)methane dianhydride, bis(2,3-dicarboxyphenyl)sulfone dianhydride, bis(3,4-dicarboxyphenyl)sulfone dianhydride, pyromellitic dianhydride, and ethyleneglycol bis trimellitic dianhydride. Those may be used alone or in combination.

As the diamine component, a diamine containing a butadiene-acrylonitrile copolymer skeleton is mentioned. Spe- For reaction with the tetracarboxylic dianhydride, another diamine compound having no polyether structure is preferably used as a diamine component together with the PE diamine compound. Examples of another diamine compound having no polyether structure include aliphatic diamine and aromatic diamine. Examples of the aliphatic diamine include ethylene diamine, hexamethylene diamine, 1,8-diaminooctane, 1,10-diaminodecane, 1,12-diaminododecane, 4,9-dioxa-1,12-diaminododecane, 1,3-bis(3-aminopropyl)-1,1,3,3-tetramethyldisiloxane(α,ω-bisaminopropyltetramethyldisiloxane), and polyoxypropylenediamine. The molecular weight of the aliphatic diamine is representatively 50 to 1,000,000, and preferably 100 to 30,000. Examples of the aromatic diamine include 4,4'-diaminodiphenylether, 3,4'-diaminodiphenylether, 3,3'-diaminodiphenylether, m-phenylenediamine, p-phenylenediamine, 4,4'-diaminodiphenyl propane, 3,3'-diaminodiphenyl methane, 4,4'-diaminodiphenyl sulfide, 3,3'-diaminodiphenyl sulfide, 4,4'-diaminodiphenyl sulfone, 3,3'-diaminodiphenyl sulfone, 1,4-bis(4-aminophenoxy)benzene, 1,3-bis(4-aminophenoxy)benzene, 1,3-bis(3-aminophenoxy)benzene, 1,3-bis(4-aminophenoxy)-2,2-dimethylpropane, and 4,4'-diaminobenzophenone.

Examples of the organic solvent used for the reaction between the tetracarboxylic dianhydride and diamine include N,N-dimethylacetamide, N-methyl-2-pyrrolidone, and N,N-dimethylformamide. In order to adjust the solubility of materials and the like, a non-polar solvent (e.g., toluene and xylene) may be used together.

The reaction temperature between the tetracarboxylic dianhydride and diamine is preferably lower than 100° C. and more preferably 50 to 90° C. In the case of using diamine containing a butadiene-acrylonitrile copolymer skeleton, the reaction temperature is preferably 100° C. or higher, and more preferably 110 to 150° C. In such a reaction temperature, gelation can be prevented and a gel component does not remain in a reaction system. Therefore, clogging and the like during filtering are prevented, whereby foreign matters are removed from the reaction system easily. Further, in such a reaction temperature, a volatile component in the resin can be removed substantially completely. Further, the oxidation and degradation of the resin can be prevented by the treatment in an inactive atmosphere.

The imidization of polyamic acid is performed by heat treatment typically in an inactive atmosphere (typically, in a vacuum or nitrogen atmosphere). The heat treatment temperature is preferably 150° C. or higher, and more preferably 180 to 450° C. In such a temperature, the volatile component in the resin can be removed substantially completely. Further, the oxidation and degradation of the resin can be prevented by the treatment in an inactive atmosphere.

The energy ray curable resin is typically a composition containing an adherent material, an energy ray curable material, and an energy ray curing initiator.

As the adherent material, any suitable adherent material is adopted depending upon the purpose. The weight-average molecular weight of the adherent material is preferably 500,000 to 1,000,000, and more preferably 600,000 to 900,000. The adherent material may be mixed with an appropriate additive such as a cross-linking agent, a tackifier, a plasticizer, a filler, or an antiaging agent.

In one embodiment, a pressure-sensitive polymer is used as the adherent material. A pressure-sensitive polymer is used preferably in the case of using a nozzle method (described later) for forming microasperity in the cleaning layer. Typical examples of the pressure-sensitive polymer include an acrylic polymer containing, as a main monomer, an acrylic monomer such as (meth)acrylic acid and/or a (meth)acrylate. The acrylic polymer is used alone or in combination. If required, an acrylic polymer may be provided with energy ray curing property by introducing an unsaturated double-bond into molecules of an acrylic polymer. As the method of introducing an unsaturated double-bond, there are, for example, a method of copolymerizing an acrylic monomer with a compound having at least two unsaturated double bonds in molecules, and a method of reacting an acrylic polymer and a functional group of a compound having at least two unsaturated double bonds in molecules.

In another embodiment, as the adherent material, rubber-based, acryl-based, vinyl alkyl ether-based, silicone-based, polyeseter-based, polyamide-based, urethane-based, and styrene-diene block copolymer-based pressure-sensitive adhesives, and pressure-sensitive adhesive whose creep properties are improved by mixing a thermal melting resin having a melting point of about 200° C. or lower (e.g., JP 56-61468 A, JP 61-174857 A, JP 63-17981 A, JP 56-13040 A) are used. These materials are used alone or in combination. These pressure-sensitive adhesives are used preferably for a cleaning member of a flat panel display substrate processing apparatus.

Specifically, the pressure-sensitive adhesive preferably includes: a rubber-based pressure-sensitive adhesive having a natural rubber or various synthetic rubbers as a base polymer; or an acrylic pressure-sensitive adhesive having as a base polymer an acrylic copolymer formed of one or two or more kinds of acrylic acid-based alkylesters which is an ester of acrylic acid or methacrylic acid containing an alkyl group having 20 or less carbon atoms, such as a methyl group, an ethyl group, a propyl group, a butyl group, an amyl group, a hexyl group, a heptyl group, a 2-ethylhexyl group, an isooctyl group, an isodecyl group, a dodecyl group, a lauryl group, a tridecyl group, a pentadecyl group, a hexadecyl group, a heptadecyl group, an octadecyl group, a nonadecyl group, and an eicosyl group.

As the acrylic copolymer, any suitable acrylic copolymer is used depending upon the purpose. The acrylic copolymer may have a cohesion, heat resistance, a cross-linking property, and the like, if required. Acrylic copolymer formed of the following two or more kinds of monomers is exemplified: carboxyl group-containing monomers such as acrylic acid, methacrylic acid, carboxylethyl acrylate, carboxypentyl acrylate, itaconic acid, maleic acid, fumaric acid, and crotonic acid; anhydride monomers such as maleic anhydride and itaconic anhydride; hydroxyl group-containing monomers such as hydroxymethyl(meth)acrylate, hydroxyethyl (meth)acrylate, hydroxypropyl(meth)acrylate, hydroxybutyl (meth)acrylate, hydroxyhexyl(meth)acrylate, hydroxyoctyl (meth)acrylate, hydroxydecyl(meth)acrylate, hydroxylauryl (meth)acrylate, and (4-hydroxymethylcyclohexyl)-methyl methacrylate; sulfonic group-containing monomers such as styrenesulfonate, allylsulfonate, 2-(meth)acrylamide-2-methylpropane sulfonate, (meth)acrylamide propane sulfonate, sulfopropyl(meth)acrylate, and (meth)acryloyloxynaphthalene sulfonate; (N-substituted)amide-based monomers such as (meth)acrylamide, N,N-dimethyl(meth)acrylamide, N-butyl(meth)acrylamide, N-methylol(meth)acrylamide, and N-methylolpropane(meth)acrylamide; alkylamino-based (meth)acrylate monomers such as aminomethyl(meth)acrylate, aminoethyl(meth)acrylate, N,N-dimethylaminoethyl (meth)acrylate, and t-butylaminoethyl(meth)acrylate; alkoxyalkyl-based (meth)acrylate monomers such as methoxyethyl(meth)acrylate and ethoxyethyl(meth)acrylate; maleimide-based monomers such as N-cyclohexylmaleimide, N-isopropylmaleimide, N-lauryl maleimide, and N-phenylmaleimide; itaconic imide-based monomers such as N-methyl itaconicimide, N-ethyl itaconicimide, N-butyl itaconicimide, N-octyl itaconicimide, N-2-ethylhexyl itaconicimide, N-cyclohexyl itaconicimide, and N-lauryl itaconicimide; succinimide-based monomers such as N-(meth) acryloyloxymethylene succinimide, N-(meth)acryloyl-6-oxyhexamethylene succinimide, and N-(meth)acryloyl-8-oxyoctamethylene succinimide; vinyl-based monomers such as vinyl acetate, vinyl propionate, N-vinylpyrrolidone, methylvinyl pyrrolidone, vinylpyridine, vinylpyperidone, vinylpyrimidine, vinylpyperadine, vinylpyradine, vinylpyrrole, vinylimidazole, vinyloxazole, vinyl morpholine, N-vinylcarboxylic acid amides, styrene, α-methylstyrene, and N-vinylcaprolactam; cyanoacrylate monomers such as acrylonitrile and methacrylonitrile; epoxy group-containing acrylic monomers such as glycidyl(meth)acrylate; glycol-based acrylester monomers such as polyethyleneglycol (meth)acrylate, polypropyleneglycol(meth)acrylate, methoxyethyleneglycol(meth)acrylate, and methoxypolypropyleneglycol(meth)acrylate; acrylate-based monomers such as tetrahydroflufuryl(meth)acrylate, fluoro (meth)acrylate, silicone(meth)acrylate, and 2-methoxyethyl acrylate; polyfunctional monomers such as hexanediol di(meth)acrylate, (poly)ethyleneglycol di(meth)acrylate, (poly)propyleneglycol di(meth)acrylate, neopentylglycol di(meth)acrylate, pentaerythritol di(meth)acrylate, trimethylolpropane tri(meth)acrylate, pentaerythritol tri(meth)acrylate, dipentaerythritol hexa(meth)acrylate, epoxyacrylate, polyester acrylate, and urethane acrylate; and appropriate monomers such as isoprene, butadiene, isobutylene, and vinylether. The ratios of those monomers or the like may be set according to the purpose.

As the energy ray curable material, any suitable material can be adopted, which reacts with the adherent material by an energy ray (preferably, light, more preferably UV-ray), and is capable of functioning as a cross-linking point (branch point) for forming a three-dimensional network structure. A typical example of the energy ray curable material includes a compound having at least one unsaturated double-bond in molecules (hereinafter, referred to as a polymerizable unsaturated compound). Preferably, the polymerizable unsaturated compound is non-volatile, and has a weight-average molecular weight of 10,000 or less, and more preferably 5,000 or less. In such a molecular weight, the adherent material can form a three-dimensional network structure with good efficiency. Specific examples of the energy ray curable material include phenoxypolyethyleneglycol(meth)acrylate, ε-caprolactone (meth)acrylate, polyethyleneglycol di(meth)acrylate, polypropyleneglycol di(meth)acrylate, trimethylolpropane tri(meth)acrylate, dipentaerythritol hexa(meth)acrylate, urethane(meth)acrylate, epoxy(meth)acrylate, oligoester(meth) acrylate, tetramethylolmethane tetra(meth)acrylate, pentaerythritolmonohydroxypenta acrylate, 1,4-butyleneglycol diacrylate, 1,6-hexanediol diacrylate, and polyethyleneglycol diacrylate. Those can be used alone or in combination. The energy ray curable material is used in a ratio of preferably 0.1 to 50 parts by weight with respect to 100 parts by weight of the adherent material.

Further, an energy ray curable resin may be used as the energy ray curable material. Specific examples of the energy ray curable resin include ester(meth)acrylate, urethane(meth) acrylate, epoxy(meth)acrylate, melamine(meth)acrylate, and acrylic resin (meth)acrylate, each of which has a (meth)acryloyl group at a molecular terminal, a thiol-ene resin and a photo cation polymerizable resin each of which has an allyl group at a molecular terminal, a polymer containing a cinnamoyl group such as polyvinyl cinnamate, a diazotized aminonovolac resin, an acrylamide-based polymer, a polymer and oligomer containing a photosensitive reactive group. Further, examples of the polymer that reacts by energy ray include epoxidated polybutadiene, unsaturated polyester, polyglycidyl methacrylate, polyacrylamide, and polyvinylsiloxane. They are used alone or in combination. The weight-average molecular weight of the energy ray curable resin is preferably 500,000 to 1,000,000, and more preferably 600,000 to 900,000.

As the energy ray curing initiator, any suitable curing initiator (polymerization initiator) can be adopted depending upon the purpose. For example, in the case of using heat as energy ray, a thermal polymerization initiator is used, and in the case of using light as energy ray, a photopolymerization initiator is used. Specific examples of the thermal polymerization initiator include benzoyl peroxide and azobisisobutyronitrile. Specific examples of the photopolymerization initiator include: benzoin ethers such as benzoinmethyl ether, benzoinethyl ether, benzoinisopropyl ether, 2,2-dimethoxy-1,2-diphenylethane-1-one; substituted benzoin ethers such as anisole methylether; substituted acetophenones such as 2,2-diethoxyacetophenone, 2,2-dimethoxy-2-phenylacetophenone, and 1-hydroxy-cyclohexyl-phenyl ketone; ketals such as benzylmethyl ketal and acetophenonediethyl ketal; xanthones such as chlorothioxanthone, dodecylthioxanthone, and dimethylthioxanthone; benzophenones such as benzophenone and Michler's ketone; substituted alpha ketols such as 2-methyl-2-hydroxypropiophenone; aromatic sulfonylchloride such as 2-naphthalene sulfonyl chloride; light-activated oxim such as 1-phenyl-1,1-propandione-2-(o-ethoxycarbonyl)-oxim; benzoyl; dibenzyl; α-hydroxycyclohexylphenyl ketone; and 2-hydroxymethylphenyl propane. The ratio of the energy ray curing initiator to be used is preferably 0.1 to 10 parts by weight with respect to 100 parts by weight of energy ray curable material.

The material forming the cleaning layer can further contain any suitable additive depending upon the purpose. Specific examples of the additive include a surfactant, a plasticizer, an antioxidant, a conductivity providing agent, a UV-absorber, and a photostabilizer. By adjusting the kind and/or amount of the additive to be used, a cleaning layer having desired properties depending upon the purpose can be obtained. For example, the adding amount of the additive is preferably 0.01 to 100 parts by weight, and more preferably 0.1 to 10 parts by weight with respect to 100 parts by weight of the adherent material.

As the energy ray, any suitable energy ray can be adopted depending upon the purpose. Specific examples of the energy ray include UV-ray, an electron beam, a radiation, and heat. UV-ray is preferred. The wavelength of the UV-ray is appropriately selected depending upon the purpose, and preferably, the central wavelength is 320 to 400 nm. Examples of a UV-ray generation source include a high-pressure mercury lamp, an intermediate pressure mercury lamp, a Xe—Hg lamp, and a deep UV lamp. The UV-ray accumulated light amount is appropriately set depending upon the purpose. Specifically, the UV-ray accumulated light amount is preferably 100 to 8,000 mJ/cm$^2$, and more preferably 500 to 5,000 mJ/cm$^2$.

The energy ray may be irradiated to an entire material for forming a cleaning layer (energy ray curable resin) or a predetermined position selectively. The area ratio between an irradiated portion and a non-irradiated portion can be set appropriately depending upon the purpose. For example, in the case of considering the transfer property in an apparatus to be important, the transfer property in an apparatus may be enhanced by relatively increasing the area ratio of the irradiated portion. In contrast, in the case of considering the foreign matter collecting property to be important, compared with the transfer property in an apparatus, the foreign matter collecting property may be enhanced by relatively increasing the area ratio of a non-irradiated portion. By adjusting the area ratio, a cleaning layer having a desired balance between the foreign matter collecting performance and the transfer performance can be obtained. As a method of selectively irradiating energy ray, any suitable method may be adopted depending upon the purpose. Examples of the method include a method of producing a mask with a predetermined pattern using an energy light shielding material, and irradiating energy ray through the mask; and a method of previously providing energy ray shielding printing to a part of a separator on a cleaning layer side, and irradiating energy ray through the separator on the cleaning layer side. Further, the pattern for blocking energy ray can be set appropriately depending upon the purpose. Specific examples of the pattern include a lattice shape, a polka-dot shape, a checkered shape, and a mosaic shape.

Examples of the method of forming microasperity of the cleaning layer include: a method of forming microasperity by discharging the above material for forming a cleaning layer through a nozzle (hereinafter, merely referred to as a nozzle method); and a method of forming microasperity using a peeling liner (hereinafter, referred to as a transfer method).

Figure 2:
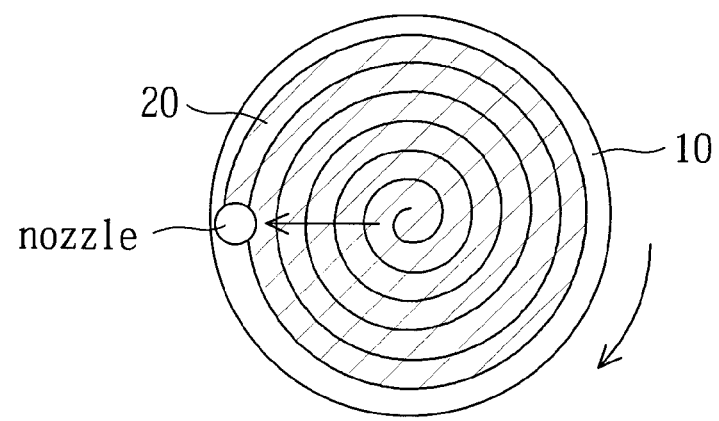
FIG. 2 is a conceptual view illustrating a nozzle method.
Figure 2:
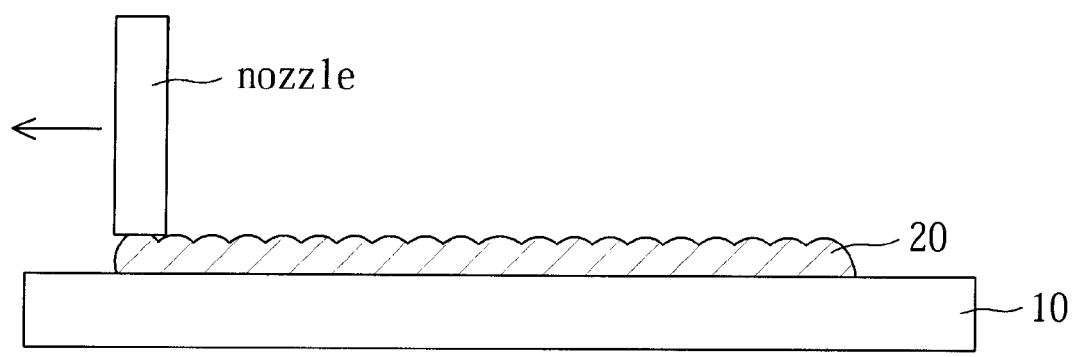

FIG. 2 is a conceptual view illustrating the nozzle method. As shown in FIG. 2, the nozzle method includes discharging a composition for forming a cleaning layer to the rotating support 10 (or a transfer member described later) through a nozzle while allowing the nozzle to scan in a radial direction of the support. By appropriately adjusting the interval between the nozzle and the support, the scan speed and/or the discharge amount of the nozzle, a desired microasperity shape can be formed. The interval between the nozzle and the support is ±5% of a desired application thickness (for example, in the case where a set application thickness is 60 μm, the interval is 57 to 63 μm). When the interval is too large, the maximum height Rz becomes too large, and the ability of effectively removing foreign matters having a predetermined particle diameter may be insufficient. When the interval is too small, the arithmetic average roughness Ra and the maximum height Rz become too large, and in this case, the ability of effectively removing foreign matters having a predetermined particle diameter may also be insufficient. The scan speed can be set appropriately corresponding to the rotation speed of the support. For example, in the case where the rotation speed of the support is 60 rpm, the scan speed is preferably 0.8 to 1.2 mm/sec. The discharge amount is preferably 1.7 to 2.5 ml/sec. For example, in the case of forming a cleaning layer with polyimide, a polyimide solution is introduced into the nozzle. The concentration of the polyimide solution can be set appropriately depending upon the purpose, the desired thickness of a cleaning layer, and the like. Specifically, the concentration is 20 to 40% by weight (concentration of a solid content). Examples of the solvent used in the solution include dimethylacetamide, N-methyl-2-pyrrolidone, N,N-dimethylformamide, methyl isobutyl ketone, and cylopentanone.

The transfer method is a method of forming microasperity using a peeling liner. As shown in FIG. 1, on a surface of the cleaning layer 20 opposite to the support 10 (i.e., a foreign matter collecting surface of the cleaning layer), the peeling liner 30 can be placed until the cleaning member is used practically. The peeling liner is typically a plastic film subjected to peeling treatment. The presence of the peeling liner prevents foreign matters from adhering to the cleaning layer before cleaning treatment, and consequently, preventing the degradation in cleaning performance of the cleaning member. By placing the peeling liner having a predetermined microasperity surface, microasperity can be formed on the cleaning layer 20. If required, the cleaning layer 20 may be subjected to predetermined pressing after the peeling liner is placed. The microasperity shape of the surface of the peeling liner may be formed in such a manner that the desired microasperity as described above is formed on the cleaning layer. Typically, the surface of the peeling liner has the arithmetic average roughness Ra and the maximum height Rz equal to the desired arithmetic average roughness Ra and maximum height Rz of the cleaning layer. The microasperity of the surface of the peeling liner is formed when the peeling surface of the peeling liner is formed (i.e., during peeling treatment of a plastic film). Specific examples of the peeling treatment include the surface treatment with a long-chain alkyl based peeling agent, a fluorine based peeling agent, an aliphatic amide based peeling agent, etc. Further, specific examples of the material forming the plastic film include: polyolefin such as polyethylene, polypropylene, polybutene, polybutadiene, and polymethylpentene; polyester such as polyethylene terephthalate and polybutylene terephthalate; polyurethane; an olefin-based copolymer such as an ethylene-vinyl acetate copolymer, an ethylene-(meth)acrylic acid copolymer, and an ethylene-(meth)acrylate copolymer; an ionomer resin; polystyrene; polycarbonate; and a heat-resistant resin such as polyimide. The thickness of the peeling liner is typically 5 to 100 μm. The nozzle method and the transfer method may be used together. In this case, typically, a cleaning layer is formed by the nozzle method, and thereafter, a microasperity shape can be further adjusted using a peeling liner.

The support 10 supports the cleaning sheet 100 so that the cleaning sheet 100 can be transferred. The thickness of the support 10 can be selected appropriately, and is preferably 500 μm or less, more preferably 3 to 300 μm, and most preferably 5 to 250 μm. The surface of the support may be subjected to conventional surface treatment, e.g., chemical or physical treatment such as chromic acid treatment, ozone exposure, flame exposure, high-pressure shock exposure, and ionized radiation treatment, or application treatment with an undercoating agent (e.g., the above adherent material) in order to enhance the adhesion with respect to an adjacent layer, a retention property, and the like. The support may be a single layer or a multilayered body.

As the support 10, any suitable support is adopted depending upon the purpose. Examples of the support include an engineering plastic film and a super engineering plastic film. Specific examples of the engineering plastic and the super engineering plastic include polyimide, polyethylene, polyethylene terephthalate, acetyl cellulose, polycarbonate, polypropylene, and polyamide. Various physical properties such as a molecular weight can be appropriately selected depending upon the purpose. Further, a method of forming a support is appropriately selected depending upon the purpose.

The cleaning sheet may have a protective film. The protective film is typically used for the purpose of protecting a cleaning layer when the cleaning layer is formed or the cleaning layer is attached (crimped) to a transfer member. Further, the protective film is used for assisting the formation of a cleaning member, so it is released in an appropriate stage. As the protective film, any suitable film is adopted depending upon the purpose. Examples of the film include: a plastic film made of polyolefin such as polyethylene, polypropylene, polybutene, polybutadiene, and polymethylpentene, polyvinyl chloride, a vinyl chloride copolymer, polyethylene terephthalate, polybutylene terephthalate, polyurethane, an ethylene vinyl acetate copolymer, an ionomer resin, an ethylene-(meth)acrylic acid copolymer, an ethylene-(meth) acrylic acid ester copolymer, polystyrene, or polycarbonate; a polyimide film; and a fluorine resin film. The protective film may be subjected to peeling treatment with a peeling agent depending upon the purpose. Examples of the peeling agent include a silicone type, a long-chain alkyl type, a fluorine type, an aliphatic amide type, and a silica type. The thickness of the protective film is preferably 1 to 100 μm. A method of forming a protective film is appropriately selected, and for example, the protective film can be formed by injection molding, extrusion, and blow molding.

B. Transfer Member Provided with a Cleaning Function

The cleaning sheet of the present invention may be used alone as a cleaning sheet, or may be used as a cleaning sheet provided on any suitable transfer member (i.e., as a cleaning sheet of a transfer member provided with a cleaning function according to the present invention). Hereinafter, the transfer member provided with a cleaning function according to a preferred embodiment of the present invention will be described.

Figure 3A:
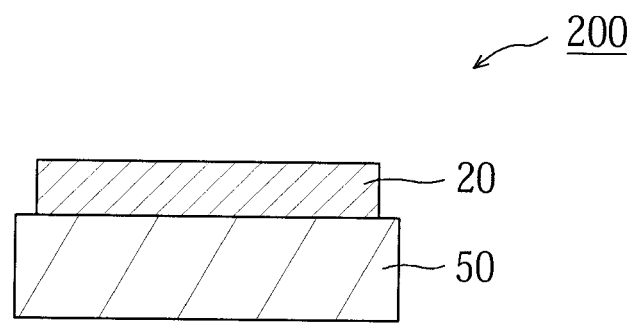
FIG. 3 are schematic cross-sectional views of a transfer member provided with a cleaning function according to the preferred embodiment of the present invention.
Figure 3B:
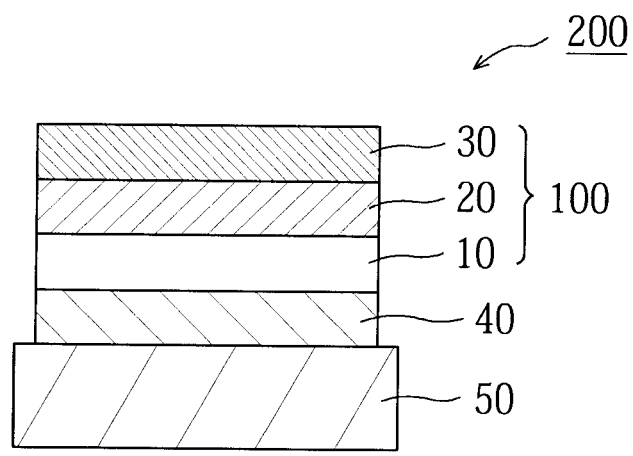

FIGS. 3(a) and 3(b) are schematic cross-sectional views of a transfer member provided with a cleaning function according a preferred embodiment of the present invention. In one embodiment, as shown in FIG. 3(a), a transfer member provided with a cleaning function 200 includes a transfer member 50 and a cleaning layer 20 on at least one surface (one surface shown in the illustrated example) of the transfer member 50. More specifically, in the embodiment, the cleaning layer 20 is attached directly to the transfer member 50. For example, in the case of forming a cleaning layer by the nozzle method, the cleaning layer is formed directly on the transfer member. In another embodiment, as shown in FIG. 3(b), a support 10 of a cleaning sheet 100 is attached to the transfer member 50 via an adhesive layer 40. In the illustrated example, a peeling liner 30 is placed on a surface of the cleaning layer 20, a surface being opposite to the support 10. Preferably, the peeling liner 30 is used for forming microasperity on the cleaning layer 20 by the transfer method as described above. That is, a cleaning layer is formed by any suitable method on the surface of the support 10, and microasperity is formed using a peeling liner. In the case of forming a cleaning layer on the support 10 by the nozzle method, the peeling liner may be used only for the purpose of preventing the contamination of the surface. Although not shown, the cleaning layer may be attached to the transfer member via the adhesive layer. By transferring the transfer member provided with a cleaning function, and moving the transfer member provided with a cleaning function while bringing it into contact with a site to be cleaned, foreign matters adhering to the apparatus can be removed by cleaning easily and securely without causing any transfer trouble by the foreign matters.

The 180° peeling adhesive strength of the adhesive layer with respect to, for example, a silicon wafer mirror surface is preferably 0.01 to 10 N/10 mm width, and more preferably 0.05 to 5 N/10 mm width. When the adhesive strength is too strong, the cleaning layer and the like may be torn during removal by peeling. Further, the thickness of the adhesive layer is appropriately set depending upon the purpose. The thickness is preferably 1 to 100 μm and more preferably 5 to 30 μm.

The material constitution for the adhesive layer is not particularly limited, and for example, an adhesive layer made of an ordinary adhesive such as an acrylic or rubber adhesive (preferably, a pressure-sensitive adhesive) is used. The acrylic adhesive is preferred. The main component of the acrylic adhesive is appropriately selected depending upon the purpose. The adhesive can be obtained, for example, by polymerizing a mixture obtained by adding another copolymerizable monomer to alkyl(meth)acrylate monomer, if required, (a mixing ratio is appropriately designed depending upon the purpose). Further, the adhesive layer may contain an additive depending upon the purpose. The weight-average molecular weight of the main component of the adhesive layer is selected appropriately depending upon the purpose, and is preferably 100,000 to 1,300,000. By setting the weight-average molecular weight in this range, the adhesive layer has desired tackiness. Further, the content of the main component of the adhesive layer is appropriately selected depending upon the purpose. Preferably, the content of the main component is 90% by weight or more of the entire adhesive layer.

As the transfer member 50, any suitable substrate is used depending upon the kind of a substrate processing apparatus from which foreign matters are to be removed. Specific examples of the substrate include a semiconductor wafer (e.g., a silicon wafer), a substrate for a flat panel display such as an LCD and a PDP, a substrate for a compact disk, an MR head, or the like.

C. Cleaning Method

According to a cleaning method of a preferred embodiment of the present invention, the transfer member provided with a cleaning function is transferred into a desired substrate processing apparatus, and is brought into contact with a site to be cleaned, whereby foreign matters adhering to the site to be cleaned can be removed by cleaning easily and securely.

The substrate processing apparatus to be cleaned by the cleaning method is not particularly limited. Specific examples of the substrate processing apparatus include, in addition to the apparatus described above in this specification, an exposure irradiation apparatus for forming a circuit, a resist applying apparatus, a sputtering apparatus, an ion injection apparatus, a dry etching apparatus, various kinds of production apparatuses and inspection apparatuses such as a wafer prover, and substrate processing apparatuses used under high temperature, such as an ozone asher, a resist coater, an oxidation diffusion furnace, an atmospheric CVD apparatus, a reduced pressure CVD apparatus, and a plasma CVD apparatus.

Hereinafter, the present invention will be described more specifically by way of examples, but is not limited to these example's. The measurement and evaluation methods in the examples are as follows. Further, a "part" in the examples is based on the weight.

(1) Arithmetic Average Roughness Ra and Maximum Height Rz

The arithmetic average roughness Ra and the maximum height Rz were measured in accordance with JIS B0601. Specifically, using a diamond stylus with a curvature of a tip end portion of 2 μm in a stylus surface roughness tester (P-11 (trade name) manufactured by Tencor Corp.), data was captured at a needle pressing force of 5 mg, a measurement speed of 1 μm/sec. (measurement length: 100 μm), and a sampling period of 200 Hz. The arithmetic average roughness was calculated with a cut-off value being 25 to 80 μm.

(2) Substantial Surface Area Per a Flat Surface of 1 $mm^2$ of a Cleaning Layer

The substantial surface area per a flat surface of 1 $mm^2$ of a cleaning layer was measured using a super-deep color 3D shape measurement microscope (VK-9500 manufactured by KEYENCE). As a sample, a cleaning layer formed on a silicon wafer, glass, or a film of 8 inches was used. An average value of three places where measurement positions from the center were 10 mm, 50 mm, and 90 mm, and a measurement area was 1 mm×1 mm was set to be a surface area. The surface area of a reference silicon wafer was 1.0002 $mm^2$ per a measurement flat surface of 1 $mm^2$.

(3) Elastic Modulus in Tension

The elastic modulus in tension was measured in accordance with JIS K7127. Specifically, the elastic modulus in tension was measured with a dynamic viscoelastic measurement apparatus by forming a cleaning layer on a predetermined base material, and peeling the cleaning layer.

(4) Peeling Adhesive Strength

A cleaning layer was formed on a silicon wafer mirror surface, and the peeling adhesive strength thereof was measured in accordance with JIS Z0237.

(5) Method of Evaluating Cleaning Performance

The cleaning performance was evaluated by measuring the number of foreign matters of 0.200 μm or more on a silicon wafer mirror surface, using a foreign matter inspection apparatus (SFS6200 manufactured by KLA Tencor) (hereinafter, referred to as an apparatus A). More specifically, the cleaning performance was evaluated by transferring a cleaning member to a liner film peeling apparatus (HR-300CW manufactured by Nitto Seiki Co., Ltd.) (hereinafter, referred to as an apparatus B) for producing a cleaning sheet, and measuring the number of foreign matters before and after the transfer of the cleaning member. A specific method is as follows.

First, a new silicon wafer was automatically transferred to the apparatus B with a mirror surface thereof faced down in such a manner that the mirror surface was brought into contact with a transfer arm and a chuck table (face-down transfer). Then, the number of foreign matters adhering to the mirror surface was measured using the apparatus A (the number of foreign matters at this time will be referred to as "foreign matter number 1"). After that, the cleaning member of the present invention was transferred to the apparatus B to perform cleaning treatment, and the new silicon wafer was transferred again so that the mirror surface thereof was faced down, and the number of foreign matters adhering to the mirror surface at this time was measured using the apparatus A (the number of foreign matters at this time will be referred to as "foreign matter number 2"). The foreign matter removal ratio was calculated by the following expression as a parameter of the cleaning effect of the cleaning member.

Foreign matter removal ratio=[100−(Foreign matter number 2)/(Foreign matter number 1)×100]%

(6) Transferability

The transferability was evaluated by transferring a cleaning member onto the chuck table by the apparatus B, performing vacuum adsorption, canceling the vacuum adsorption, and thereafter, checking whether or not the cleaning member can be peeled from the chuck table with a lift pin.

EXAMPLE 1

200 parts of polyethylene glycol dimethacrylate (NK ester 4G (trade name) manufactured by Shin-Nakamura Chemical Co., Ltd.), 3 parts of a polyisocyanate compound (COLONATE (trade name) manufactured by Nippon Polyurethane Industry Co., Ltd.), and 3 parts of benzyl methyl ketal (IRGACURE 651 (trade name), photopolymerization initiator, manufactured by Ciba Specialty Chemicals Holding Inc.) were mixed uniformly with respect to 100 parts of an acrylic polymer (weight-average molecular weight: 700,000) obtained from a monomer mixture liquid composed of 75 parts of 2-ethylhexyl acrylate, 20 parts of methyl acrylate, and 5 parts of acrylic acid, whereby a composition for forming a cleaning layer A (a UV-curable pressure-sensitive adhesive solution) was obtained.

The composition A was applied to a mirror surface of a silicon wafer under the following conditions using a circular coater. Herein, the circular coater is an apparatus described in JP 2001-310155 A, and the disclosure of the publication is incorporated herein as reference.

Nozzle movement rate: 1.0 mm/sec.

Table rotation number: 60 rpm

Application direction: end of a wafer from the center

Discharge amount: 2.1 ml/sec.

Gap: 63 μm

A silicon wafer with the pressure-sensitive adhesive solution A applied thereto was dried with a hot plate (HB-01 manufactured by ASAP) at 150° C. for 10 minutes, and thereafter, a protective film (long-chain polyester film treated with a non-silicone peeling agent: thickness of 25 μm) was attached to the surface of the silicon wafer. Then, the silicon wafer was irradiated with UV-ray having a central wavelength of 365 nm from the protective film side at an accumulated light amount of 1,000 mJ/cm$^2$, and a cleaning layer was formed of the applied layer of the pressure-sensitive adhesive solution. Finally, the protective film was peeled to obtain a transfer member provided with a cleaning function A. The thickness of the cleaning layer of the transfer member A was 16.4 μm, Ra thereof was 0.09 μm, Rz thereof was 0.82 μm, and the substantial surface area per a flat surface of 1 mm$^2$ of the cleaning layer was 174% of the substantial surface area per a flat surface of 1 mm$^2$ of the silicon wafer mirror surface. Further, the elastic modulus in tension of the cleaning layer was 1.5 MPa, and the 180° peeling adhesive strength with respect to the mirror surface of the silicon wafer was 0.05 N/10 mm.

The number of foreign matters of 0.200 μm or more on a mirror surface of a new silicon wafer of 8 inches, which was particle managed, was measured to be two by the apparatus A. The wafer was transferred to the apparatus B with the mirror surface faced down, and the number of foreign matters of 0.200 μm or more was measured to be 8,742 by the apparatus A (foreign matter number 1). Further, the transfer member provided with a cleaning function A was transferred to the apparatus B to perform cleaning treatment without any trouble. The new silicon wafer was transferred to the apparatus B, subjected to the above cleaning treatment, with the mirror surface faced down, and the number of foreign matters of 0.200 μm or more was measured to be 1,924 by the apparatus A (foreign matter number 2). The foreign matter removal ratio calculated from the foreign matter number 1 and the foreign matter number 2 was 78.0% as a whole.

EXAMPLE 2

Ethylene-1,2-bistrimeriate, 30.0 g of tetracarboxylic dianhydride (TMEG), 65.8 g of diamine (ATBN1300×16 manufactured by Ube Industries Ltd., amine equivalence 900, acrylonitryl content 18%) represented by the following chemical formula, and 15.0 g of 2,2'-bis[4-(4-aminophenoxy)phenyl] propane (BAPP) were mixed to be reacted in 258 g of N-methyl-2-pyrrolidone (NMP) at 120° C. in a nitrogen airstream, so the solid content concentration was 30 wt %. The mixture was cooled to obtain a polyamic acid solution B with a viscosity of 750 cp.

[Chemical Formula 2]

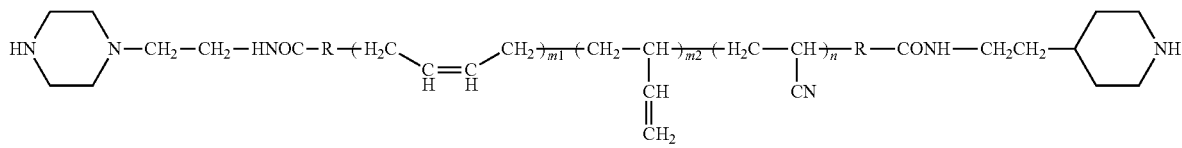

(m1 and m2 represent integers of 0 or more, n represents an integer of 1 or more, R represents a single bond, or an organic group.)

A silicon wafer having a polyamic acid application layer was obtained in the same way as in Example 1 except for using the solution B. The silicon wafer was heat-treated at 300° C. for 2 hours in a nitrogen atmosphere to form a cleaning layer made of polyimide. Thus, a transfer member provided with a cleaning function B was obtained. The thickness of the cleaning layer of the transfer member B was 15.2 μm, Ra thereof was 0.03 μm, Rz thereof was 0.80 μm, and the substantial surface area per a flat surface of 1 $mm^2$ of the cleaning layer was 193% of the substantial surface area per a flat surface of 1 $mm^2$ of a silicon wafer mirror surface. Further, the elastic modulus in tension of the cleaning layer was 420 MPa, and the 180° peeling adhesive strength with respect to a silicon wafer mirror surface was 0.03 N/10 mm.

The number of foreign matters of 0.200 μm or more on a mirror surface of a new silicon wafer of 8 inches, which was particle managed, was measured to be three by the apparatus. A. The wafer was transferred to the apparatus B with the mirror surface faced down, and the number of foreign matters of 0.200 μm or more was measured to be 9,684 by the apparatus A (foreign matter number 1). Further, the transfer member provided with a cleaning function B was transferred to the apparatus B to perform cleaning treatment without any trouble. The new silicon wafer was transferred to the apparatus B, subjected to the above cleaning treatment, with the mirror surface faced down, and the number of foreign matters of 0.200 μm or more was measured to be 1,462 by the apparatus A (foreign matter number 2). The foreign matter removal ratio calculated from the foreign matter number 1 and the foreign matter number 2 was 84.9% as a whole.

COMPARATIVE EXAMPLE 1

A transfer member provided with a cleaning function C was obtained in the same way as in Example 2 except that the application conditions were set as follows. The thickness of the cleaning layer of the transfer member C was 14.7 μm, Ra thereof was 0.78 μm, Rz thereof was 1.54 μm, and the substantial surface area per a flat surface of 1 $mm^2$ of the cleaning layer was 121% of the substantial surface area per a flat surface of 1 $mm^2$ of a silicon wafer mirror surface.

Nozzle movement rate: 1.5 mm/sec.
Table rotation number: 60 rpm
Application direction: end of a wafer from the center
Discharge amount: 2.1 ml/sec.
Gap: 50 μm The number of foreign matters of 0.200 μm or more on a mirror surface of a new silicon wafer of 8 inches, which was particle managed, was measured to be three by the apparatus A. The wafer was transferred to the apparatus B with the mirror surface faced down, and the number of foreign matters of 0.200 μm or more was measured to be 11,035 by the apparatus A (foreign matter number 1). Further, the transfer member provided with a cleaning function C was transferred to the apparatus B to perform cleaning treatment without any trouble. The new silicon wafer was transferred to the apparatus B, subjected to the above cleaning treatment, with the mirror surface faced down, and the number of foreign matters of 0.200 μm or more was measured to be 8,350 by the apparatus A (foreign matter number 2). The foreign matter removal ratio calculated from the foreign matter number 1 and the foreign matter number 2 was 24.3% as a whole.

EXAMPLE 3

50 parts of urethane acrylate, 3 parts of benzyl methyl ketal, and 3 parts of diphenylmethane diisocyanate were mixed uniformly with respect to 100 parts of an acrylic polymer (weight-average molecular weight: 700,000) obtained from a monomer mixture liquid composed of 75 parts of 2-ethylhexyl acrylate, 20 parts of methyl acrylate, and 5 parts of acrylic acid, whereby a composition for forming a cleaning layer was obtained. The composition was applied to a peeling-treated surface of a polyester-based peeling liner (thickness: 38 μm, arithmetic average roughness Ra of a peeling-treated surface: 0.4 μm, maximum height Rz: 0.92 μm) so that the thickness after curing (i.e., the thickness of the cleaning layer to be obtained) was 35 μm, whereby a laminate was produced.

On the other hand, a pressure-sensitive adhesive solution obtained in the same way as in the above except for removing benzyl methyl ketal from the composition for forming a cleaning layer was applied to one side of a support made of polyethylene terephthalate with a width of 250 mm and a thickness of 75 μm, so the thickness after drying was 20 μm, followed by drying, to provide an adhesive layer, and the polyester-based peeling liner (thickness: 38 μm) was attached to the surface of the adhesive layer.

A layer of the laminate, to which a composition for forming a cleaning layer was applied, was attached to the other side of the support. Then, UV-ray with a central wavelength of 365 nm was irradiated at an accumulated light amount of 1,000 $mJ/cm^2$ to form a cleaning layer from the application layer, whereby a cleaning sheet of the present invention was obtained. Ra of the cleaning layer from which the peeling liner has been peeled was 0.37 μm, Rz thereof was 0.78 μm, and the substantial surface area per a flat surface of 1 $mm^2$ of the cleaning layer was 182% of the substantial surface area per a flat surface of 1 $mm^2$ of a silicon wafer mirror surface. Further, a sample for measurement was produced separately in the same way as in the above production method, and the elastic modulus in tension of the cleaning layer was calculated to be 90 MPa.

The peeling liner of the cleaning sheet obtained in the above on the adhesive layer side was peeled, and the cleaning sheet was attached to a mirror surface of a silicon wafer of 8 inches with a hand roller, whereby a transfer member provided with a cleaning function D was obtained.

On the other hand, two wafer stages of the substrate processing apparatus were removed, and the number of foreign matters of 0.300 μm or more on the mirror surface of a silicon wafer of 8 inches was measured to be 20,300 by the apparatus A. The peeling liner of the transfer member D on the cleaning layer side was peeled, and the transfer member D was transferred in the substrate processing apparatus having the wafer stages with 20,300 foreign matters adhering thereto, whereby cleaning treatment was performed. The cleaning treatment was repeated three times without any trouble. After that, the wafer stages were removed, and the number of foreign matters of 0.300 μm or more on the mirror surface of a silicon wafer of 8 inches was measured to be 6,050, and ⅔ or more of the foreign matters adhering to the mirror surface before cleaning treatment were removed.

COMPARATIVE EXAMPLE 2

A transfer member provided with a cleaning function E was produced in the same way as in Example 3 except that UV-irradiation was not performed. The transfer member E was transferred in the substrate processing apparatus, with the result that the transfer member adhered to the wafer stages and could not be transferred.

COMPARATIVE EXAMPLE 3

A transfer member provided with a cleaning function F was produced in the same way as in Example 1 except that a cleaning layer was formed on a peeling liner with a surface roughness Ra of 0.02 μm and Rz of 0.08 μm. Ra of the cleaning layer of the transfer member was 0.02 μm, Rz thereof was 0.07 μm, and the substantial surface area per a flat surface of 1 $mm^2$ of the cleaning layer was 116% of the substantial surface area per a flat surface of 1 $mm^2$ of a silicon wafer mirror surface. The transfer member F was transferred in the substrate processing apparatus, whereby cleaning treatment was performed. The cleaning treatment was repeated three times without any trouble. However, the foreign matter removal ratio by cleaning treatment was 32.8%, and the foreign matters were not removed sufficiently.

EXAMPLE 4

44.27 g of polyoxypropylenediamine (XTJ-510 manufactured by Mitsui Fine Chemicals Inc.) and 25.34 g of 4,4'-diaminodiphenyl ether were dissolved in 398.44 g of N-methyl-2-pyrrolidone. Next, 30.00 g of pyromellitic dianhydride was added to the mixture and allowed to react therewith. The resultant reactant was cooled to obtain a polyamic acid solution G.

A silicon wafer having a polyamic acid application layer was obtained in the same way as in Example 1 except for using the polyamic acid solution G. The silicon wafer was heat-treated at 300° C. for 2 hours in a nitrogen atmosphere to form a cleaning layer made of polyimide. Thus, a transfer member provided with a cleaning function G was obtained. The thickness of the cleaning layer of the transfer member G was 11.4 μm, Ra thereof was 40 nm, Rz thereof was 60 nm, and the substantial surface area per a flat surface of 1 $mm^2$ of the cleaning layer was 172% of the substantial surface area per a flat surface of 1 $mm^2$ of a silicon wafer mirror surface. Further, the elastic modulus in tension of the cleaning layer was 200 MPa, and the 180° peeling adhesive strength with respect to a silicon wafer mirror surface was 0.04 N/10 mm.

The number of foreign matters of 0.200 μm or more on a mirror surface of a new silicon wafer of 8 inches, which was particle managed, was measured to be one by the apparatus A. The wafer was transferred to the apparatus B with the mirror surface faced down, and the number of foreign matters of 0.200 μm or more was measured to be 14,230 by the apparatus A (foreign matter number 1). Further, the transfer member provided with a cleaning function G was transferred to the apparatus B to perform cleaning treatment without any trouble. The new silicon wafer was transferred to the apparatus B, subjected to the above cleaning treatment, with the mirror surface faced down, and the number of foreign matters of 0.200 μm or more was measured to be 2,613 by the apparatus A (foreign matter number 2). The foreign matter removal ratio calculated from the foreign matter number 1 and the foreign matter number 2 was 81.6% as a whole.

As is apparent from the results of the examples and the comparative examples, by forming a cleaning layer with a predetermined surface roughness, the performance of removing foreign matters having a particle diameter of 0.2 μm or more can be enhanced remarkably.

INDUSTRIAL APPLICABILITY

A transfer member provided with a cleaning function of the present invention is used preferably for cleaning of a substrate processing apparatus such as various kinds of production apparatuses and inspection apparatuses.

The invention claimed is:
1. A cleaning sheet comprising a cleaning layer having a microasperity shape having an arithmetic average roughness Ra of 0.05 μm or less and a maximum height Rz of 1.0 μm or less, wherein the cleaning layer has an elastic modulus in tension of 0.98 MPa to 4900 MPa.
2. The cleaning sheet according to claim 1, wherein the microasperity shape is a groove structure.
3. The cleaning sheet according to claim 2, wherein the groove structure is formed in a whirl shape.
4. A transfer member provided with a cleaning function, comprising:
   a transfer member; and
   the cleaning layer according to claim 1, provided on at least one surface of the transfer member.
5. The transfer member provided with a cleaning function according to claim 4, wherein the cleaning layer is directly attached to the transfer member.
6. The transfer member provided with a cleaning function according to claim 4, wherein the cleaning layer is attached to the transfer member via a pressure-sensitive adhesive layer.
7. A method of cleaning a substrate processing apparatus, comprising:
   transferring a cleaning sheet comprising a cleaning layer having a microasperity shape having an arithmetic average roughness Pa of 0.05 μm or less and a maximum height Rz of 1.0 μm or less in the substrate processing apparatus in manner that the cleaning sheet contacts a site of the substrate processing apparatus to be cleaned, wherein the cleaning layer has an elastic modulus in tension of 0.98 NPa to 4900 MPa.
8. The method according to claim 7, wherein the cleaning sheet is on at least one surface of a transfer member.

* * * * *